(12) United States Patent
Teh et al.

(10) Patent No.: US 11,442,878 B2
(45) Date of Patent: Sep. 13, 2022

(54) MEMORY SEQUENCER SYSTEM AND A METHOD OF MEMORY SEQUENCING USING THEREOF

(71) Applicant: SKYECHIP SDN BHD, Bayan Lepas Pulau Pinang (MY)

(72) Inventors: Chee Hak Teh, Bayan Lepas Pulau Pinang (MY); Soon Chieh Lim, Bayan Lepas Pulau Pinang (MY)

(73) Assignee: SKYECHIP SDN BHD, Bayan Lepas (MY)

( * ) Notice: Subject to any disclaimer, the term of this patent is extended or adjusted under 35 U.S.C. 154(b) by 0 days.

(21) Appl. No.: 17/169,427

(22) Filed: Feb. 6, 2021

(65) Prior Publication Data
US 2022/0164298 A1 May 26, 2022

(30) Foreign Application Priority Data
Nov. 20, 2020 (MY) .............................. PI2020006133

(51) Int. Cl.
*G06F 13/16* (2006.01)
*G01R 31/317* (2006.01)
*G06F 13/40* (2006.01)

(52) U.S. Cl.
CPC ... *G06F 13/1668* (2013.01); *G01R 31/31724* (2013.01); *G06F 13/4027* (2013.01)

(58) Field of Classification Search
CPC .............. G06F 13/1668; G06F 13/4027; G01R 31/31724
See application file for complete search history.

(56) References Cited

U.S. PATENT DOCUMENTS

| 2004/0103258 A1* | 5/2004 | Blackmon ........... G11C 11/4076 711/167 |
| 2004/0268030 A1* | 12/2004 | Cheung ..................... H04N 5/33 348/E5.081 |
| 2005/0021921 A1* | 1/2005 | Blackmon ........... G06F 13/1631 711/158 |
| 2005/0257109 A1 | 11/2005 | Averbuj et al. |
| 2008/0219112 A1 | 9/2008 | Olofsson et al. |
| 2019/0163378 A1* | 5/2019 | Carlough ............... G06F 3/0619 |
| 2021/0407613 A1* | 12/2021 | Eliash ..................... G11C 29/14 |

* cited by examiner

Primary Examiner — Nimesh G Patel
(74) Attorney, Agent, or Firm — Aslan Law, P.C.

(57) ABSTRACT

A memory sequencer system for external memory protocols including a control center and a microcontroller; a control center network-on-chip having nodes connected point-to-point to synchronize and co-ordinate communication; whereby a command and address sequencer to generate command, control and address commands for specific memory protocols; and at least one data sequencer to generate pseudo-random or deterministic data patterns for each byte lane of a memory interface; wherein said command and address sequencer and said data sequencer are chained to form complex address and data sequences for memory interface training, calibrating and debugging; wherein said control center network-on-chip interconnecting the control center with said command and address sequencer and data sequencer to provide firmware controllability.

21 Claims, 16 Drawing Sheets

MEMORY SEQUENCER SYSTEM AND A METHOD OF MEMORY SEQUENCING USING THEREOF

CROSS-REFERENCE TO RELATED APPLICATIONS

This application claims priority to Malaysian Patent Application No. PI2020006133 filed on Nov. 20, 2020, the entire contents of which are hereby incorporated by reference.

TECHNICAL FIELD

This invention relates generally to memory management. More particularly, the present invention relates to a memory sequencer system and a method for memory sequencing for external memory protocol.

BACKGROUND ART

Modern computer architecture incorporates three principal memory technologies dominant in supercomputing which are dynamic random-access memory (DRAM), static random-access memory (SRAM), and magnetic storage media, including hard-disk drives and tapes. The main memory is the primary component for storing data within a computer and is composed almost entirely of DRAM technology.

In modern computer systems, one or more DRAM memory controllers (DMCs) may be contained in the processor package or integrated into a system controller that resides outside of the processor package. Regardless of the location of the DRAM memory controller, its functionality is to accept read and write requests to a given address in memory, translate the request to one or more commands to the memory system, issue those commands to the DRAM devices in the proper sequence and proper timing, and retrieve or store data on behalf of the processor or I/O devices in the system.

US2005257109A1 discloses a built-in self-test (BIST) architecture having distributed algorithm interpretation is described. The architecture includes three tiers of abstraction: a centralized BIST controller, a set of sequencers, and a set of memory interfaces. The BIST controller stores a set of commands that generically define an algorithm for testing memory modules without regard to the physical characteristics or timing requirements of the memory modules. The sequencers interpret the commands in accordance with a command protocol and generate sequences of memory operations. The memory interfaces apply the memory operations to the memory module in accordance with physical characteristics of the memory module, e.g., by translating address and data signals based on the row-column arrangement of the memory modules to achieve bit patterns described by the commands. The command protocol allows powerful algorithms to be described in an extremely concise manner that may be applied to memory modules having diverse characteristics.

US2008219112A1 discloses an apparatus for generating a digital signal pattern comprises a memory, a program sequencer, first and second circuits, and an event execution unit. The memory may have stored therein a plurality of instructions that, when executed, cause a digital signal pattern to be generated on a plurality of nodes. The program sequencer may be configured to control a sequence in which the plurality of instructions are retrieved from the memory and executed. The first circuit may sequentially step through a plurality of different output states in response to a clock signal. The second circuit may identify an output event when an output state of the first circuit corresponds to an output state identified by retrieved instructions of a particular type. The event execution unit may control states of signals on the plurality of nodes in a manner specified by the retrieved instructions of the particular type in response to the second circuit identifying an output event.

The aforementioned references may strive to support pattern-based address and data sequencers. Nevertheless, they have a number of limitations and shortcomings. For instance, the memory sequencer architectures in the aforementioned references only support pattern-based address and data sequencers that limiting the pattern complexity that can be driven due to the shallow pattern queue. The existing memory sequencers are targeted to only support one or two memory protocols and is not reprogrammable to support different memory protocols. Furthermore, the aforementioned references typically support non-concurrent single addressing stream for either row or column addressing. Other than that, the biggest challenges in scaling the memory sequencer system is to address the ability to synchronize the different sequencers attached to the control center network-on-chip (CCNOC) so that they can be orchestrated deterministically to form signal to the wide memory interface protocol.

Accordingly, there remains a need to have a memory sequencer system which overcomes the aforesaid problems and shortcomings.

SUMMARY OF THE INVENTION

The following presents a simplified summary of the invention in order to provide a basic understanding of some aspects of the invention. This summary is not an extensive overview of the invention. Its sole purpose is to present some concepts of the invention in a simplified form as a prelude to the more detailed description that is presented later.

It is an objective of the present invention to provide a memory sequencer system that orchestrate the signaling sequencing using command and address sequencer and data sequencer as means.

It is also an objective of the present invention to provide a memory sequencer system that allow the sequencer to be chained together with triggers to form complex sequences.

It is yet another objective of the present invention to provide a memory sequencer system that supports partitioning between protocol agnostic and protocol specific blocks to support scalability across different memory protocols for example concurrent row and column command sequencing for high bandwidth memory (HBMx) or single address stream command sequencing for double data rate (DDRx) and low-power double data rate (LPDDRx).

It is a further objective of the present invention to provide a memory sequencer system that support with highly programmable control center and highly scalable control center network-on-chip (CCNOC) capable of self-enumeration and triggering across different sequencers via its timestamp synchronization architecture.

It is also an objective of the present invention to provide a method for memory sequencing for external memory protocol.

Accordingly, these objectives may be achieved by following the teachings of the present invention. The present invention relates to a memory sequencer system for external memory protocols comprising: a control center comprising a microcontroller; a control center network-on-chip comprising nodes connected point-to-point to synchronize and co-ordinate communication; characterized by a command and address sequencer to generate command, control and address commands for specific memory protocol and at least one data sequencer to generate pseudo-random or deterministic data patterns for each byte lane of a memory interface; wherein the command and address sequencer and the data sequencer are chained to form complex address and data sequences for memory interface training, calibrating and debugging; wherein the control center network-on-chip interconnecting the control center with the command and address sequencer and data sequencer to provide firmware controllability.

The present invention also relates to a method of memory sequencing for external memory protocols characterized by the steps of: generating command, address and data sequence for each entry; selecting one or more address sequencers for generating address; comparing a trigger value to trigger incrementing of adder or comparator to the address sequencers; chaining the adder or comparator to construct address sequences; encoding and decoding the command and address to trigger data path; implementing the data latency with a shift register according to a number of clock cycles; transmitting the data including write data and read data to a data sequencer; converting AXI-lite read or write commands into control center network-on-chip read or write commands; transferring the control center network-on-chip read or write commands to targeted slave nodes of the control network-on-chip based on the address and identification of the slave nodes; enumerating the slave nodes to assign the identification to each slave node; and synchronizing control center network-on-chip timestamp and alarm registers.

The foregoing and other objects, features, aspects and advantages of the present invention will become better understood from a careful reading of a detailed description provided herein below with appropriate reference to the accompanying drawings.

BRIEF DESCRIPTION OF THE DRAWING

So that the manner in which the above recited features of the present invention can be understood in detail, a more particular description of the invention, briefly summarized above, may have been referred by embodiments, some of which are illustrated in the appended drawings. It is to be noted, however, that the appended drawings illustrate only typical embodiment of this invention and is therefore not to be considered limiting of its scope, for the invention may admit to other equally effective embodiments.

These and other features, benefits, and advantages of the present invention will become apparent by reference to the following text figure, with like reference numbers referring to like structures across the view, wherein:

FIG. 12 illustrates the alternative method for timestamp synchronization across all slaves.

DETAILED DESCRIPTION OF THE INVENTION

Figure 1:
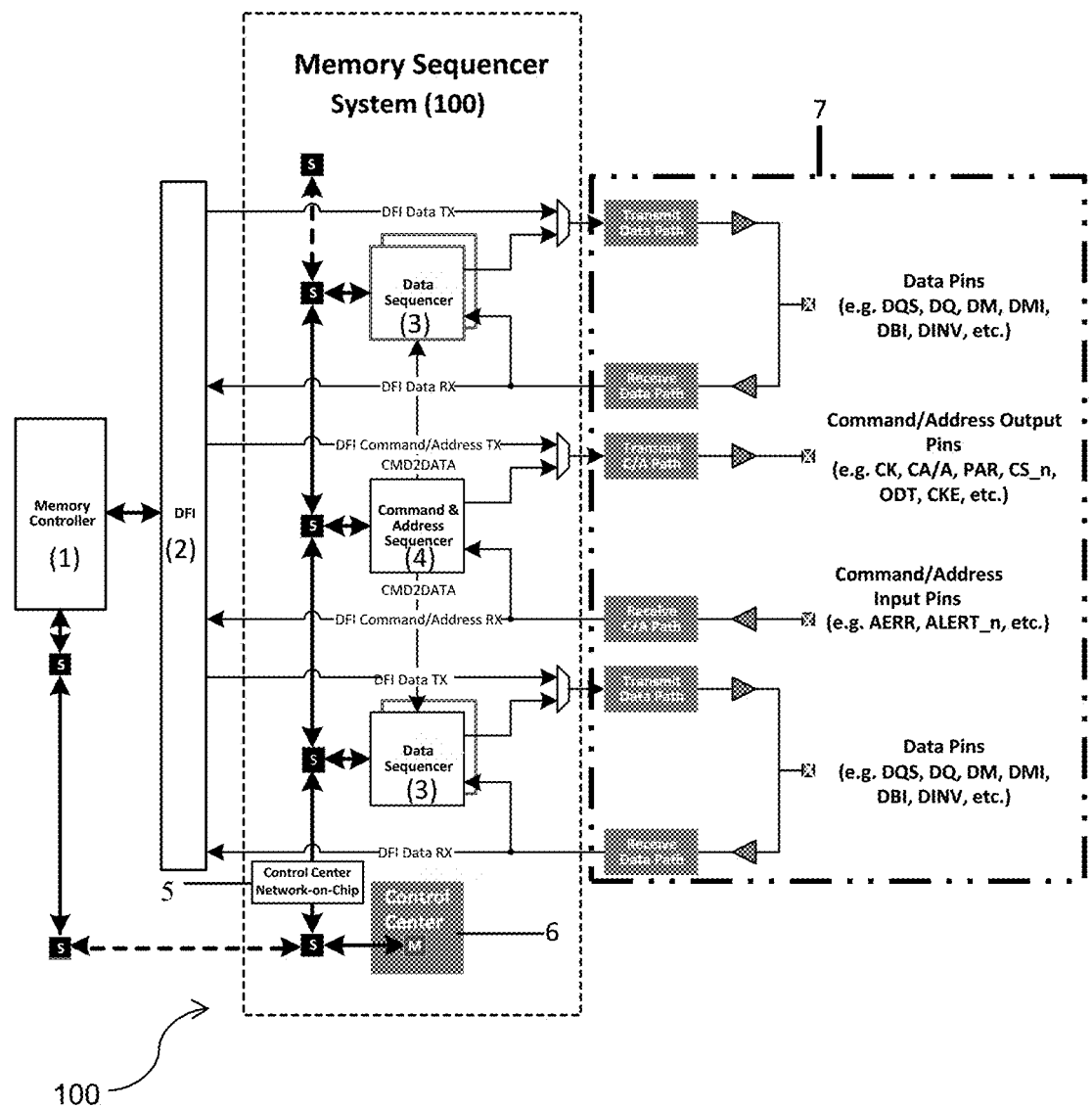
FIG. 1 shows a block diagram of a memory sequencer system within memory physical layer subsystem according to an embodiment of the present invention.

As required, detailed embodiments of the present invention are disclosed herein; however, it is to be understood that the disclosed embodiments are merely exemplary of the invention, which may be embodied in various forms. Therefore, specific structural and functional details disclosed herein are not to be interpreted as limiting but merely as a basis for claims. It should be understood that the drawings and detailed description thereto are not intended to limit the invention to the particular form disclosed, but on the contrary, the invention is to cover all modifications, equivalents and alternatives falling within the scope of the present invention as defined by the appended claims. As used throughout this application, the word "may" is used in a permissive sense (i.e., meaning having the potential to), rather than the mandatory sense (i.e., meaning must). Similarly, the words "include," "including," and "includes" mean including, but not limited to. Further, the words "a" or "an" mean "at least one" and the word "plurality" means one or more, unless otherwise mentioned. Where the abbreviations or technical terms are used, these indicate the commonly accepted meanings as known in the technical field.

The present invention is described hereinafter by various embodiments with reference to the accompanying drawings, wherein reference numerals used in the accompanying drawings correspond to the like elements throughout the description. This invention may, however, be embodied in many different forms and should not be construed as limited to the embodiment set forth herein. Rather, the embodiment is provided so that this disclosure will be thorough and complete and will fully convey the scope of the invention to those skilled in the art. In the following detailed description, numeric values and ranges are provided for various aspects of the implementations described. These values and ranges are to be treated as examples only, and are not intended to limit the scope of the claims. In addition, a number of materials are identified as suitable for various facets of the implementations. These materials are to be treated as exemplary, and are not intended to limit the scope of the invention.

Referring to the drawings as shown in FIGS. 1 to 12, the invention will now be described in more details.

Referring to FIG. 1, the present invention relates to a memory sequencer system (100) for external memory protocol comprising: a control center (CC) (6) comprising a microcontroller (62); a control center network-on-chip (CCNOC) (5) comprising nodes (51) connected point-to-point to synchronize and co-ordinate communication; characterized by a command and address sequencer (4) to generate command, control and address commands for specific memory protocols; and at least one data sequencer (3) to generate pseudo-random or deterministic data patterns for each byte lane of a memory interface; wherein the command and address sequencer (4) and the data sequencer (3) are chained to form complex address and data sequences for memory interface training, calibrating and debugging; wherein the control center network-on-chip (5) interconnecting the control center (6) with the command and address sequencer (4) and data sequencer (3) to provide firmware controllability.

In accordance with an embodiment of the present invention, the memory sequencer system (100) is inserted in between a DDR PHY Interface (DFI) (2) of a memory controller (1) and a physical layer's transmit or receive path (7) for the memory interface command and data.

In accordance with an embodiment of the present invention, the firmware running on the control center's (6) microcontroller which is loaded into the control center's (6) static random-access memory (SRAM) is responsible to configure and setup the command and address sequencer (4) and data sequencer (3) via the control center network-on-chip (CCNOC) (5) based on the intended memory protocol to interface to. The main function of the control center (6) is to perform the external memory interface initialization sequence to initialize the memory host and the memory device attached. The control center (6) also performs calibration and training so that the physical layer can reliably transmit and receive to and from the external memory via its command and data busses. The special sequences to the memory device on behalf of the memory controller are also perform by the control center (6). The core of the control center is a microcontroller (62) which comprises two or three stage pipelined single issue in order processor. Besides the microcontroller (62), the other two masters on the AXI-lite interconnect is the Joint Test Action Group (JTAG) controller (61) and the direct memory access (DMA) (63).

Figure 2:
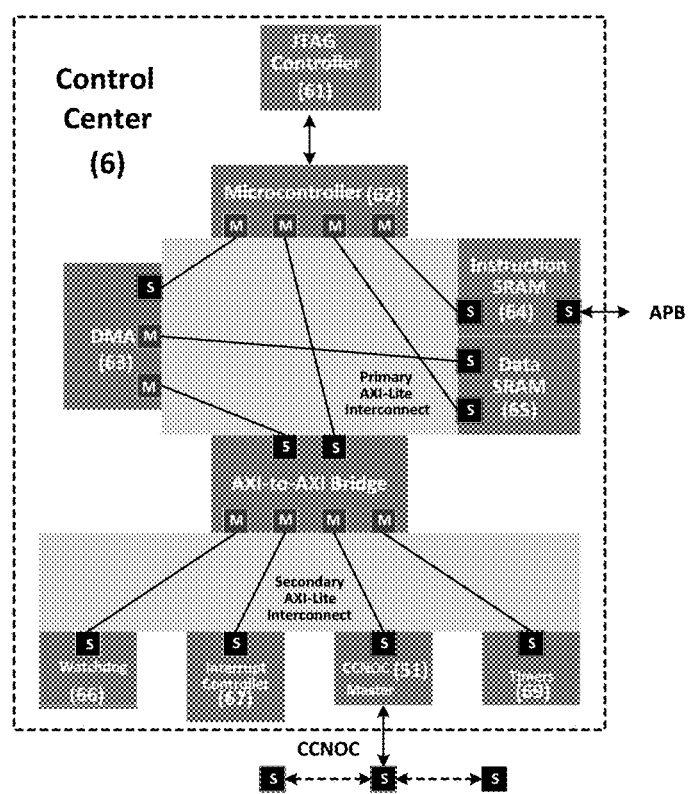
FIG. 2 shows a block diagram of a control center according to an embodiment of the present invention.

Referring to FIG. 2, the JTAG controller provides JTAG access for external host such as a personal computer or a tester to access the AXI-lite interconnect. The JTAG controller (61) can issue AXI reads or writes to any location on the memory map. The JTAG controller (61) can be used to probe or override registers values for debug purposes. The JTAG controller (61) can also be used to download firmware into the Instruction SRAM (64) that the microcontroller (62) can execute from. The DMA (63) is meant to offload the microcontroller (62) from moving large chunk of data. The main purpose is to move data in and out of the various buffers of all channels and data paths of the host memory physical layer, to or from the Data SRAM (65). The Data SRAM (65) is used for general storage while the Instruction SRAM (65) is used to store firmware for the microcontroller (62). Other peripheries such as the programmable input or output (I/O), interrupt controller (67), timer (69) and watchdog (66) provide auxiliary services to the microcontroller (62) to complete the standalone subsystem.

Figure 3:
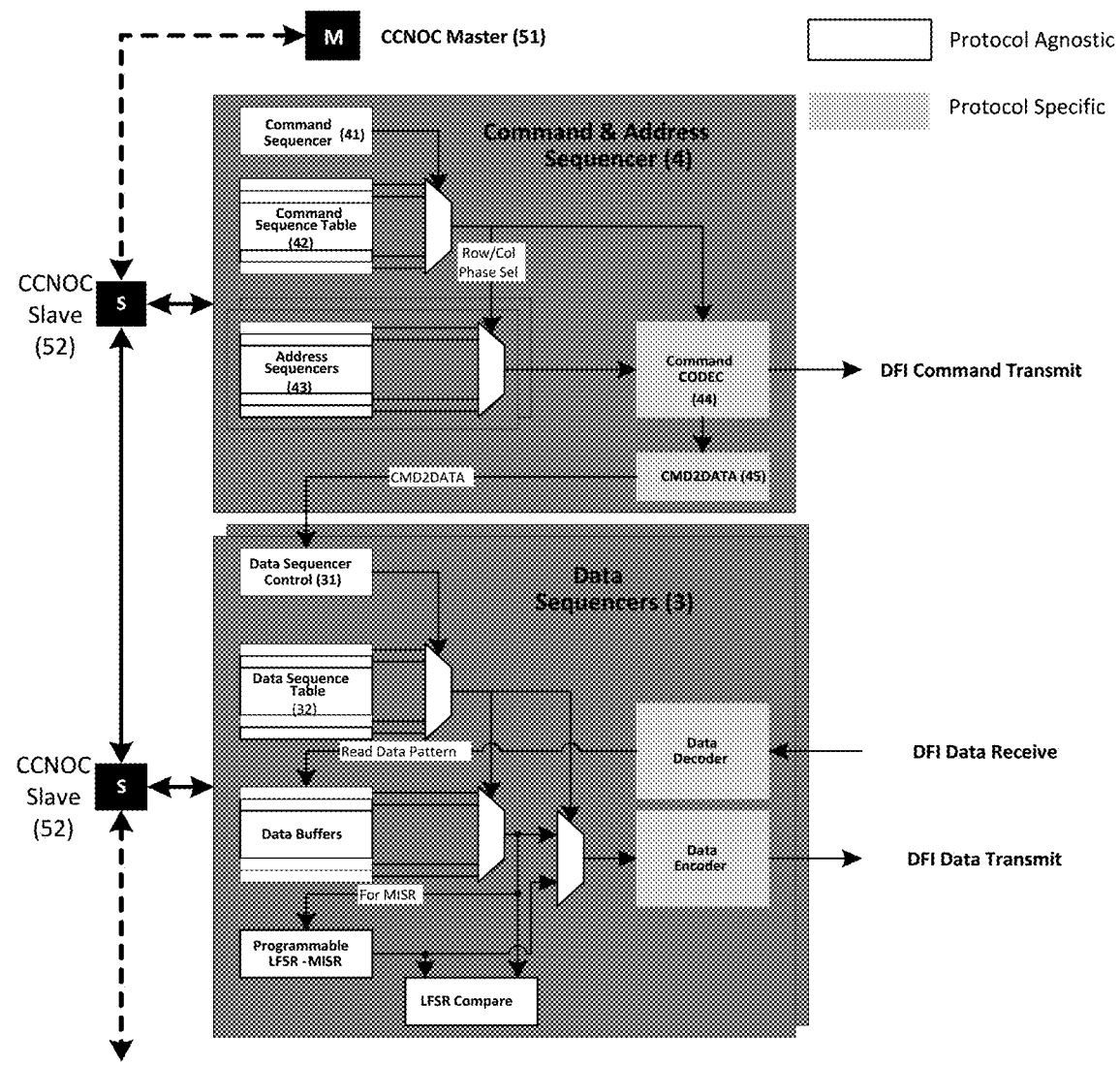
FIG. 3 shows a block diagram of a command and address sequencer and data sequencer according to an embodiment of the present invention.

Referring to FIG. 3, the command and address sequencer (4) comprising a command sequencer (41) and an address sequencer (43). The command and address sequencer (4) orchestrates the signalling sequences with the help of the distributed data sequencers.

In accordance with an embodiment of the present invention, the command and address sequencer (4) comprising a command sequence table (42) to interpret each entry by cycling through said table to orchestrate command, address or data sequence generation. The command sequence table (42) may comprise multiple entries deep with each entry having a number of fields. For instance, the command sequence table (42) is eight entries deep with each entry having the fields as shown in Table 1 under the examples and the example of use of the command sequence table (42) is shown in Table 2 under the examples.

Figure 4:
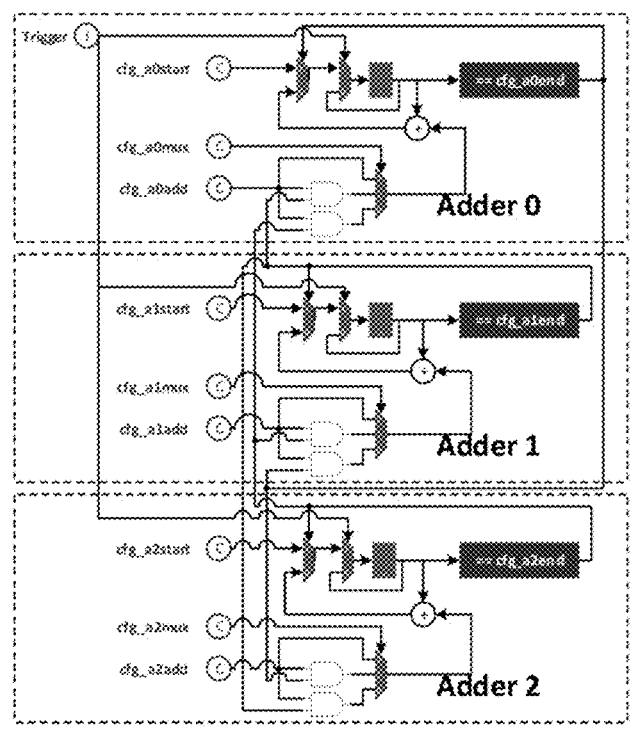
FIG. 4 shows a block diagram of address sequencer according to an embodiment of the present invention.

Referring to FIG. 4, the entries of command sequencer (41) will select one or more of the address sequencers that is responsible for address generation. The number of address sequencer (43) follow the number of entries in command sequence table that can be used for either row or column address generation. For example, if the command sequence table comprise eight entries, the address sequencers shall comprise eight address sequencers. Each address sequencer (43) comprising a set of adders or comparators to trigger incrementing of a different adder or comparator set within the same set based on a trigger value. For instance, each address sequencer (43) may comprise but not limited to three sets of adders or comparators. This allows for the address sequencer (43) to either increment by a fixed address offset every cycle it is indexed or increment by a fixed address offset only when it is triggered by another adder or comparator set. Chaining of the adders or comparators in a different sequence will construct different addressing sequences.

In accordance with an embodiment of the present invention, the command and address sequencer (4) comprising a command encoder and a command decoder.

In accordance with an embodiment of the present invention, the data sequencer (3) further comprising a read data storage having a read data buffer.

In accordance with an embodiment of the present invention, the control center network-on-chip (CCNOC) (5) connected through CCNOC master (68) to AXI-lite to receive, convert and deliver read or write commands into a network within the memory sequencer system (100).

Figure 5:
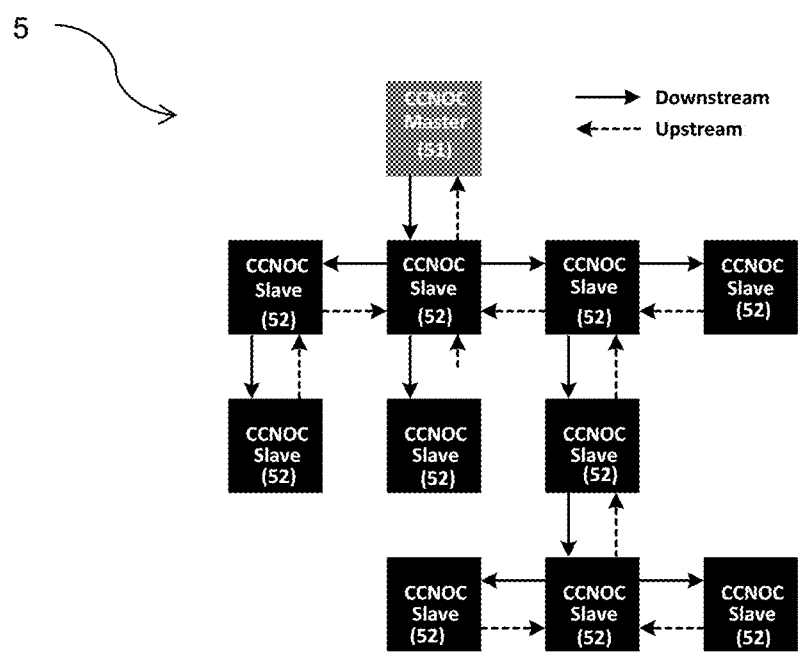
FIG. 5 shows a tree topology of the command center network-on-chip (CCNOC) according to an embodiment of the present invention.

Referring to FIG. 5, the control center network-on-chip (CCNOC) (5) comprising a master node (51) and a plurality of slave nodes (52) organized in a tree topology, each node comprising a set of registers that is memory mapped to AXI memory space. The configuration registers are used to control the functionality of the memory sequencer as well as other blocks within the memory physical layer (7) and the memory controller (1). For example, the registers can be used to set the delay of the transmit first-in-first-out (TX FIFO) and receiving first-in-first-out (RX FIFO). The command and address sequencer (CAS) and data sequencer (DS) are also mapped to the configuration registers of one of the slave nodes. Every register is 32-bits wide. The maximum number of registers supported for each slave node is 1024× 32-bit registers or 4096 bytes.

Figure 6:
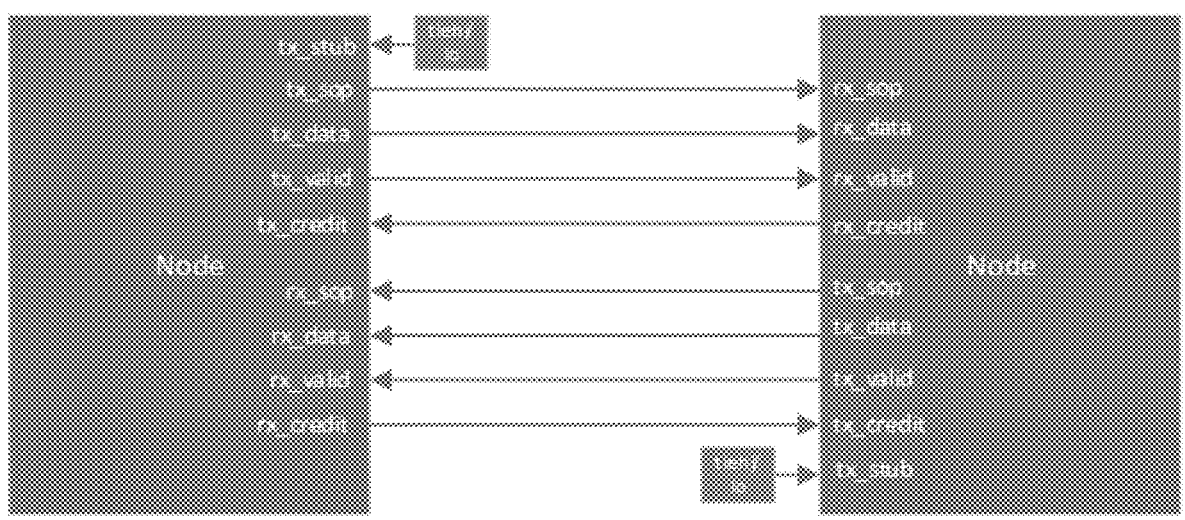
FIG. 6 shows the connections between the nodes in command center network-on-chip (CCNOC) according to an embodiment of the present invention.

In accordance with an embodiment of the present invention, the master node (51) has multiple downstream ports, each slave node (52) has one upstream port and multiple downstream ports. Each upstream or downstream port will have the pin list as shown in Table 3 under the examples. Moreover, the direct connection between the ports of the CCNOC nodes is shown in FIG. 6. However, the actual implementation of the connection may have pipe stages inserted in between the nodes for timing closure.

Figure 7:
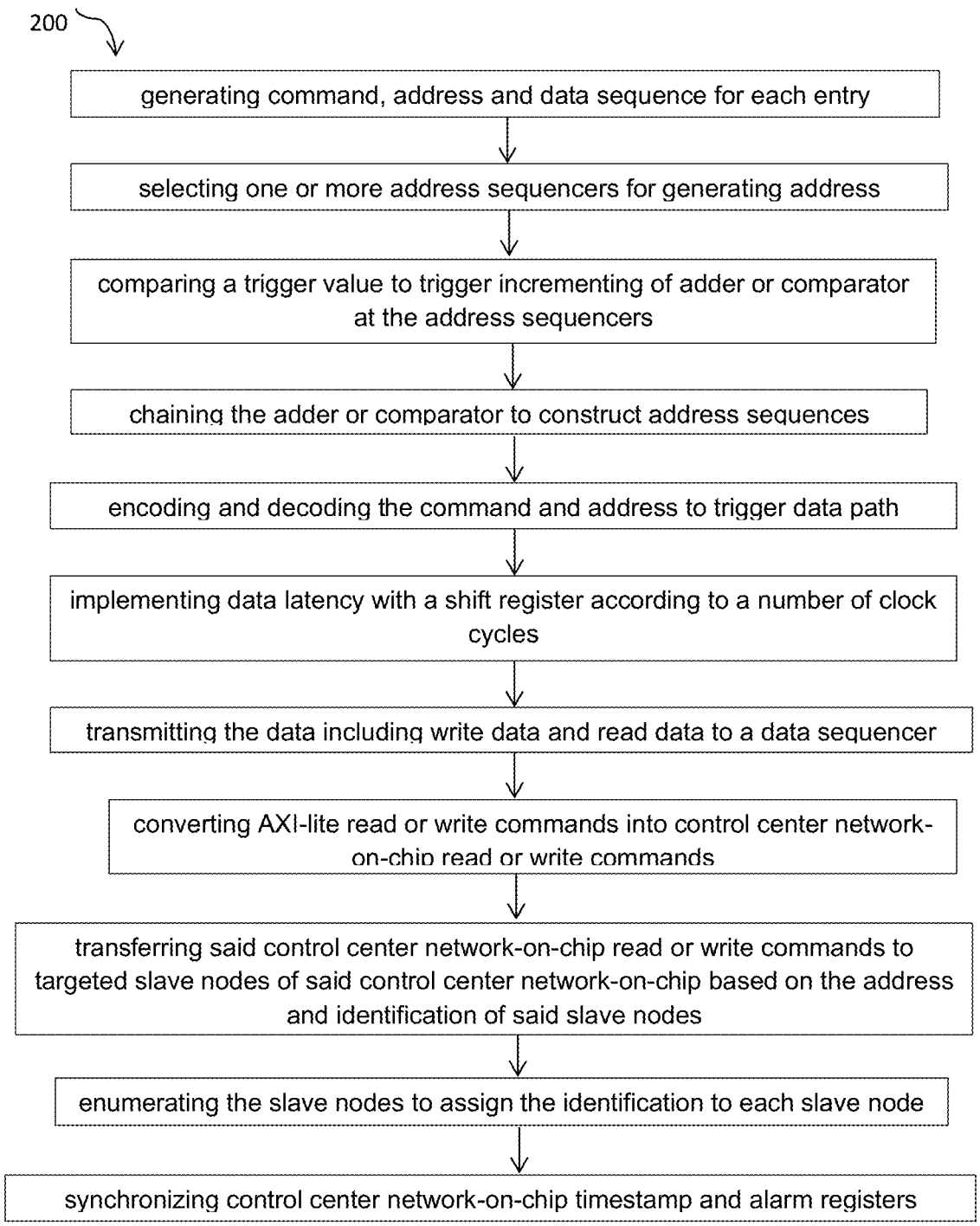
FIG. 7 shows a method for memory sequencing for external memory protocol according to an embodiment of the present invention.

Referring to FIG. 7, the present invention also relates to a method (200) of memory sequencing for external memory protocols, said method characterized by the steps of: generating command, address and data sequence for each entry; selecting one or more address sequencers (43) for generating address; comparing a trigger value to trigger incrementing of adder or comparator at the address sequencers (43); chaining the adder or comparator to construct address sequences; encoding and decoding the command and address to trigger data path; implementing data latency with a shift register according to a number of clock cycles; transmitting the data including write data and read data to a data sequencer; converting AXI-lite read or write commands into control center network-on-chip read or write commands; transferring said control center network-on-chip read or write commands to targeted slave nodes (52) of said control center network-on-chip (5) based on the address and identification of said slave nodes (52); enumerating the slave nodes (52) to assign the identification to each slave node (52); and synchronizing control center network-on-chip timestamp and alarm registers.

In accordance with an embodiment of the present invention, the command, address and data sequence are generated according to programming values of a command sequence table (42).

In accordance with an embodiment of the present invention, the programming values determines amount of delay for the command, address and data sequence.

In accordance with an embodiment of the present invention, encoding a write command triggers write transmit data path and encoding a read command triggers read receive data path to capture and upload the data from the memory device. Depending on the external memory protocol, the command encoder may take either one phase, P0 or P1; two phases, P0 and P1; or three phases, P0, P1 and P0 of the next cycle to encode the row or column commands.

In accordance with an embodiment of the present invention, decoding a read command triggers write transmit data path and decoding a write command triggers read receive data path to capture and unload the data from the memory host. The command decoder is used to decode the incoming command if the memory sequencer is used as a memory device instead of the memory host. The command decoder is used to receive commands from the RX FIFO of the row or column receive data paths of command and address pins.

In accordance with an embodiment of the present invention, both the command encoder and decoder use the CMD2DATA interface (45) to control the relevant transmit or receive data path. The CMD2DATA interface (45) is basically implementing the read latency or write latency with a shift register. When a read is triggered by the command encoder or decoder, the read trigger is delayed by N number of memory cycles before the trigger is delivered to the respective data sequencer (3). When a write is triggered by command encoder or decoder, the write trigger is delayed by M number of memory cycles before the trigger is delivered to the respective data sequencer (3). Since the read and write latency is typically several clock cycles, this gives ample opportunity to pipeline the CMD2DATA bus as many times as needed to reach the furthest data sequencer (3) from the command and address sequencer (4). Each data sequencer (3) that is nearer by a pipeline will be configured to have one less internal delay to ensure that all data sequencer (3) will be able to send or received the data in the same number of memory cycles to or from the data bus pins.

In accordance with an embodiment of the present invention, the step of transmitting the write data comprising cycling through a write data sequence table to generate a write data transmitting pattern. The write data sequence table comprises a number of entries deep with each entry having a number of fields. An example of write data sequence table is shown in Table 4 under the example that comprise eight entries deep with each entry having the field In accordance with an embodiment of the present invention, the step of transmitting the read data comprising cycling through a read data sequence table to generate a read data transmitting pattern. The read data sequence table comprises a number of entries deep with each entry having a number of fields. An example of read data sequence table is shown in Table 5 under the example that comprise eight entries deep with each entry having the field.

In accordance with an embodiment of the present invention, the targeted slave node (52) will be assigned to the packets destination ID field based on the address and then the packet is sent downstream. When the packet reaches a slave node (52), the slave node (52) will check the identification of the packet destination. If the identification belongs to the salve node (52), then it will perform a read or a write on the addressed config register that is attached to it. If the identification does not belong to the slave node (52), the slave node (52) will send the packet to all its downstream ports. Eventually, the packet will be claimed by a slave node (52) further downstream. If the identification is for a broadcast write or a selective broadcast write and the slave node (52) is part of the selective broadcast set, the slave node (52) will claim the packet. The slave node (52) will additionally broadcast the broadcast write or selective-broadcast write to all its downstream ports regardless if it claimed the packet for itself or not.

In accordance with an embodiment of the present invention, the commands are transferred in a packet comprising write packet (53), read packet (54), completion packet (55) and message packet (56).

Figure 8:
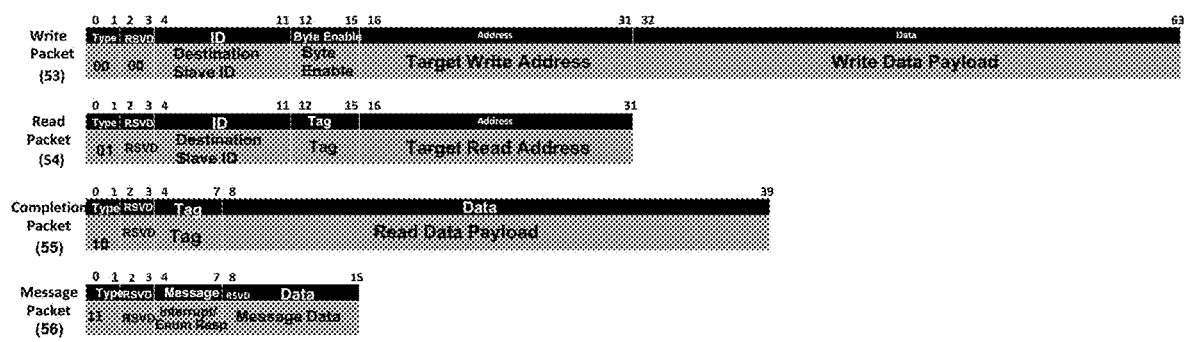
FIG. 8 shows the packet types of a command center network-on-chip (CCNOC) according to an embodiment of the present invention.

Referring to FIG. 8, the write packets (53) down the CCNOC (5) are always posted, more specifically the targeted slave node (52) will not respond with a write respond or completion packet (55). The master node (51) will send the AXI write response immediately after it issues a write packet (53) down the CCNOC (5). Write packets (53) can be broadcasted to all slave nodes (52), if the destination ID on the packet is all ones. Each slave node (52) will also keep an ID mask to allow for selective broadcast. Read packets (54) down the CCNOC are always split transaction, in other words the targeted slave node (52) does not need to respond with a read completion packet (55) immediately. If the master node (51) sends multiple read packets (54) to different slave nodes (52), the read completion packets (55) can return out of order to the master node (51). The master node (51) is responsible to reorder the read completions and send the AXI read response in order. Read packets (54) will never have the destination ID equal all ones as the read packets (54) do not support broadcast. Read completion packets (55) can always reach the master node (51) because there is only one upstream port. If an AXI master sends a read or write with an address that falls within the address range of the CCNOC slaves but is not mapped to any of the slave node (52), then the CCNOC Master node (51) will still respond with a fixed data pattern of 0xDEAD_BEEF on reads. For writes, the CCNOC Master will not do anything, and the returned write response is OKAY. A status register in the CCNOC Master node (51) will be set to indicate that an AXI access was mapped to a non-existent Slave ID.

In accordance with an embodiment of the present invention, the step of synchronizing control center network-on-chip timestamp comprising sending a read packet (54) from control center network-on-chip master node (51) to one slave node (52); reading the timestamp register of the slave node (52); recording the sending time of the read packet (54); sending a read response to the read packet (54) when the slave node (52) receives the read packet (54); recording the receiving time of read response by control center network-on-chip master node (51); sending a write packet (53) with current timestamp and pipeline delay data to the timestamp register of the slave node (52) and repeating the preceding steps from sending a read packet (54) to slave node (52) until all slave nodes have the same timestamp as control center network-on-chip master node (51). The pipeline delay is half of a round trip delay and the round trip delay is the difference between the receiving time of the read response and the sending time of read packet.

Referring to FIG. 12, the step of synchronizing control center network-on-chip timestamp further comprising programming the timestamp offset register of control center network-on-chip master node (51) and slave node (52) with the number of clock cycles; broadcasting a write packet (53) from control center network-on-chip master node (51) to all slave nodes (52) with a packet's data payload; setting the timestamp register value of slave node (52) with the received data; sending the written timestamp value to the downstream slave node (52) and repeating the preceding steps from setting the timestamp register value until all slaves have the same timestamp as control center network-on-chip master node (51). The write packet (53) travel from control center network-on-chip master node (51) to the control center network-on-chip slave node (52) according to the number of clock cycles and the data payload containing the timestamp value of the control center network-on-chip master node (51).

In accordance with an embodiment of the present invention, the timestamp is used in alarm triggering to perform synchronized actions across all slave node (52). The slave node (52) in timestamp synchronization and alarm triggering implement the registers listed in Table 6 with the timestamp register being a free running rollover counter that increments every rising clock edge.

Hereinafter, examples of the present invention will be provided for more detailed explanation. It will be understood that the examples described below are not intended to limit the scope of the present invention.

Examples

Generate Command, Address and Data Sequence

TABLE 1

| Name | Symbol | # Bits | Description |
|---|---|---|---|
| Delay Count | delay | 8 | Number of DFI cycles of delay to apply before/after the command cycle |
| Pre/Post Delay | post_delay | 1 | If 1, the delay will be applied after the command cycle |
| Row Command Phase 0 | row_sel_p0 | 3 | Select the corresponding address sequencer for phase P0 |
| Row Command Phase 1 | row_sel_p1 | 3 | Select the corresponding address sequencer for phase P1 |
| Column Command Phase 0 | col_sel_p0 | 3 | Select the corresponding address sequencer for phase P0 |
| Column Command Phase 1 | col_sel_p1 | 3 | Select the corresponding address sequencer for phase P1 |
| Loop Counter Select | loop_select | 2 | Select 1 of 4 loop counters |
| Branch Equal Zero Pointer | bez | 3 | Next table entry index if the selected loop counter is 0 |
| Branch Not Equal Zero Pointer | bnz | 3 | Next table entry index if the selected loop counter is not zero |
| End of Sequence | end | 1 | Indicates the last entry of a sequence |

Table 1 shows command sequence table fields of the entry of command sequence table. The command sequencer uses the values programmed in the command sequence table (42) to interpret the nature of operations to perform. The Delay Count or Pre or Post Delay settings work in tandem to decide on the amount of delay to insert before or after the operation. If the Pre or Post Delay is set to 1, then the Delay Count is applied after the operation is done, else, it is applied before. The Delay Count counts the number DFI cycles to wait before or after the operation. During the delay count period, no operation (NOP) cycles will be injected.

The phase 0 and phase 1 fields for both the row and column commands allows for different commands to be initiated during the different phases of a clock. For example, if the command is to be inserted during the high phase of the clock which is phase 0, the row or column command phase 0 will be used. If the command is to be inserted during the low phase of the clock which is phase 1, the row or column command phase 1 will be used. Not all memory interface protocols allow for different commands on different phases of the clock. For memory interface protocols that only allow a clock level granularity command insertion, the phase 1 row and column commands can be programmed to 7 (3'b111) to be ignored or removed. For memory interface protocols that only supports non-concurrent row and column accesses such as double data rate (DDRx) and low-power double data rate (LPDDRx) either the row or column command phase will be used.

Upon completing the command, the loop counter select, branch equal zero pointer and branch not equal zero pointer fields work together to determine the next entry from the command sequence table to execute. The loop counter select is used to select 1 out of 4 loop counters to use. Loop counter 0 is always 0 while the other 3 loop counters can be preconfigured with different values by the control center (6)

Upon completion of the command, the loop count pointed to by the loop counter select will be decremented by 1. If the loop counter after decrementing is zero, the next entry of the command sequence table to execute will be the entry pointed to by the branch equal zero pointer. If the loop counter after decrementing is not zero, the next entry of the command sequence table to execute will be the entry pointed to by the branch not equal zero pointer. Hence, the firmware is able to configure the command sequence table to implement loops and complex sequences even when limited to just eight entries in the table.

TABLE 2

| En-try | Delay Count | Pre/Post Delay | Row P0 | Row P1 | Col P0 | Col P1 | Loop Select | BEZ | BNZ | End |
|---|---|---|---|---|---|---|---|---|---|---|
| 0 | 5 | 1 | 1 | 7 | 7 | 7 | 1 | 1 | 0 | 0 |
| 1 | 2 | 0 | 7 | 7 | 2 | 7 | 2 | 1 | 0 | 1 |
| 2 | X | X | X | X | X | X | X | X | X | X |
| 3 | X | X | X | X | X | X | X | X | X | X |
| 4 | X | X | X | X | X | X | X | X | X | X |
| 5 | X | X | X | X | X | X | X | X | X | X |
| 6 | X | X | X | X | X | X | X | X | X | X |
| 7 | X | X | X | X | X | X | X | X | X | X |

Loop Counter 0 = 0 (Fixed)
Loop Counter 1 = 4
Loop Counter 2 = 1
Loop Counter 3 = X (Unused)

Table 2 shows an example use of the command sequence table (42). At cycle 0, the pointer for entry being executed (current_ptr) is at entry 0 and the row command output for phase 0 is selected from address sequencer 1. At cycle 1 t0 4, all the command outputs are 7 (3'b111), NOP cycle is injected due to the post delay of 5 being programmed. At cycle 5, since the loop counter is not zero, the loop counter is decremented by 1 and the entry 0 execution is repeated 4 more times. At the cycle 30, the loop counter 1 is expired so current_ptr is now at entry 1 and since the pre or post delay is 0, the command sequencer (41) will wait an additional two cycles before executing entry 1. At cycle 32, the column command output for phase 0 is selected from address sequencer 2. Since loop counter 2 is 1 and branch not equal zero pointer (BNZ) is 0, the current_ptr will jump back to entry 0. The sequence from cycle 0 to cycle 32 to be reissued again as the address will still increment due to address sequencer 1 progressing. At cycle 65, the loop counter 2 is now 0 and End is 1 so the sequence will end. Thus, the overall command stream is <START>→<row cmd 0@p0>→<5 cycles delay>→<row cmd 0@p0>→<5 cycles delay>→<row cmd 0@p0>→<5 cycles delay>→<row cmd 0@p0>→<5 cycles delay>→<row cmd 0@p0>→<5 cycles delay>→<2 cycles delay>→<col cmd 1@p0>→<row cmd 0@p0>→<5 cycles delay>→<row cmd 0@p0>→<5 cycles delay>→<row cmd 0@p0>→<5 cycles delay>→<row cmd 0@p0>→<5 cycles delay>→<2 cycles delay>→<col cmd 1@p0>→<END>.

Construct Address Sequences

Referring to FIG. 4, the address sequencer (43) can be used to cycle through the bank and SID for row address 0 and address 1. SID is referred to the stack ID address of a high bandwidth memory (HBM) memory device. Assume that adder 0 is mapped to bank address, adder 1 is mapped to the row address and adder 2 is mapped to the SID of a HBM channel. Adder 0 address register is loaded with the starting value of the bank address, bank 0; adder 1 address register loaded with the starting value of the row address, address 0; and adder 2 is loaded with the starting value of the SID, SID 0. Adder 0 is configured to trigger when the row address, adder 1 is triggered, adder 1 is configured to trigger every cycle the command sequencer (41) triggers it while adder 2 is configured to trigger when the bank address, adder 0 triggers. All three adder's increment value is set to 1 to increment by one count when triggered. Next, adder 0 end address is configured to the value of bank 1, adder 1 end address is also configured to the value of row address 1 and adder 2 is configured to the value of SID 3. When the command sequencer (41) first triggers the address sequencer (43), it will output bank address 0, row address 0 and SID 0. The next value for row address is 1. When the command sequencer (41) triggers the address sequencer (43) for the second time, it will output bank address 0, row address 1 and SID 0. Since the row address of 1 matches the end address for row, it will reset its value back to the starting value which is row address 0 and assert its trigger to trigger the bank address, adder 0 to increment to bank address 1. The next time the command sequencer (41) queries the address sequencer (43), it will output bank address 1, row address 0 and SID 0. The third time the command sequencer (41) triggers the address sequencer (43), it will output bank address 1, row address 1 and SID 0. Since the bank address of 1 matches the end address for bank and row address of 1 matches the end address for row, the bank address will reset its value back to the starting value which is bank address 0 and assert its trigger to trigger the SID. The next time the command sequencer (41) triggers the address sequencer (43), it will output bank address 0, row address 0 and SID 1. This process then repeats.

CCNOC Port Pins

TABLE 3

| Name | # Bits | Description |
|---|---|---|
| tx_sop | 1 | Start of downstream packet |
| tx_data | 8 | Downstream packet payload |
| tx_valid | 1 | Indicates if the current tx_data has valid data |
| tx_credit | 2 | Transmit credits |
| tx_stub | 1 | If tied to 1, then this Node is the last node on this CCNOC branch. This node will not send out any packets out from this port. |
| rx_sop | 1 | Start of upstream packet |
| rx_data | 8 | Upstream packet payload |
| rx_valid | 1 | Indicates if the current rx_data has valid data |
| rx_credit | 2 | Receive credits |

Table 3 shows the port pins list of the CCNOC upstream and downstream port as illustrated in FIG. 6.

Transmit Data to Data Sequencer

TABLE 4

| Name | Symbol | # Bits | Description |
|---|---|---|---|
| Loop Counter Select | loop_select | 2 | Select 1 of 4 loop counters |
| LFSR Select | lfsr_sel | 1 | Selects data source either from LFSR or Data Buffer: 1: LFSR 0: Data Buffer |

TABLE 4-continued

| Name | Symbol | # Bits | Description |
|---|---|---|---|
| Data Select | data_sel | 3 | Select one out of 8 entries of the Data Buffer if lfsr_sel = 0 |
| Branch Equal Zero Pointer | bez | 3 | Next table entry index if the selected loop counter is 0 |
| Branch Not Equal Zero Pointer | bnz | 3 | Next table entry index if the selected loop counter is not zero |
| End of Sequence | end | 1 | Indicates the last entry of a sequence |

Table 4 shows write data sequence table fields of the entry of write data sequence table. The cycling through the write data sequence table is similar to that of the command sequence table. The only exception is that the source of the data pattern to transmit is dependent on either a linear-feedback shift register (LFSR) output or the write data buffer contents pointed to by the field data_sel. If lfsr_sel is 1, then the LFSR output is used as the write data. Else, the contents of the write data buffer pointed to by data_sel is used. There is also no pre or post delay select for the write sequence table hence the delay is always applied after the data is transmitted. The write data buffer is a local first-in-first out storage that is eight entries deep that allows for any custom pattern to be driven by each pin. The data_sel points to one of the entries containing the data to be transmitted.

Figure 9:
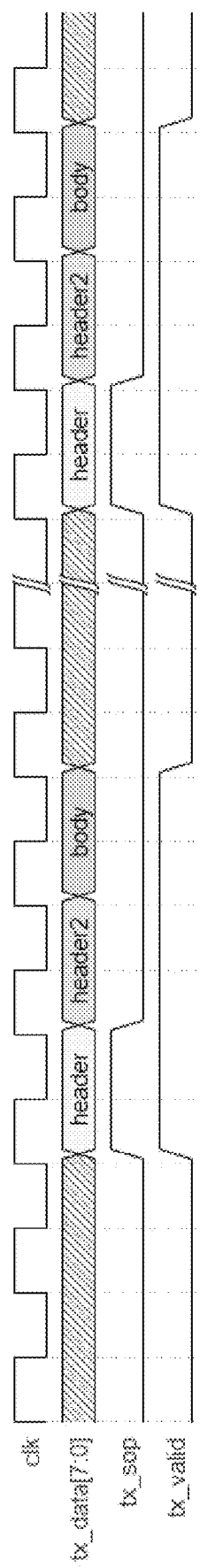
FIG. 9 shows an example of packet transfer in command center network-on-chip (CCNOC) according to an embodiment of the present invention.

Referring to FIG. 9, The LFSR structure used by the Write Data Sequencer is fully programmable to cater for it to transmit with any LFSR polynomial. The LFSR feedback paths are fully configurable by cfg_lfsr_poly[N−1:0]. When cfg_lfsr_poly[N] is 1, then the feedback path from dataout [0] is XOR-ed into FF[N]. The LFSR seed is initialized into the LFSR shift register when cfg_lfsr_init is asserted. This LFSR structure can also be used for multiple-input signature register (MISR) but cfg_misr_en is always de-asserted in the write sequencer hence only used in the read sequencer. The write data sequencer is also used to generate the data pattern when the memory sequencer is used as a memory device.

TABLE 5

| Name | Symbol | # Bits | Description |
|---|---|---|---|
| Loop Counter Select | loop_select | 2 | Select 1 of 4 loop counters |
| LFSR Select | lfsr_sel | 1 | Selects data source either from LFSR or Data Buffer: 1: LFSR 0: Data Buffer |
| Data Select | data_sel | 3 | Select one out of 8 entries of the Data Buffer if lfsr_sel = 0 |
| Branch Equal Zero Pointer | bez | 3 | Next table entry index if the selected loop counter is 0 |
| Branch Not Equal Zero Pointer | bnz | 3 | Next table entry index if the selected loop counter is not zero |
| End of Sequence | end | 1 | Indicates the last entry of a sequence |

Table 5 shows read data sequence table fields of the entry of read data sequence table. The read data storage contains a read data buffer that is used to temporarily buffer the data received. To operate on the received data, the Read Data Sequence table as shown in Table 5 is used. The read data sequence table functions exactly the same as that of the write data sequence table and can be shared physically and logically if both the read and write data sequencers are not required to operate concurrently. The data captured in the Read Data Buffer can be stored in the read data buffer to be read out by the firmware for future operations, debug and checking. The data can be fed into a programmable MISR chain to generate a unique signature for comparison. The data also can compare with a programmable LFSR chain to determine for a match or exact bit mismatch. The same programmable LFSR-MISR chain is used to either generate the unique MISR signature or be used to generate the LFSR data to be compared to the data in the read data buffer for reads.

CCNOC Packet Transfer

Figure 10:
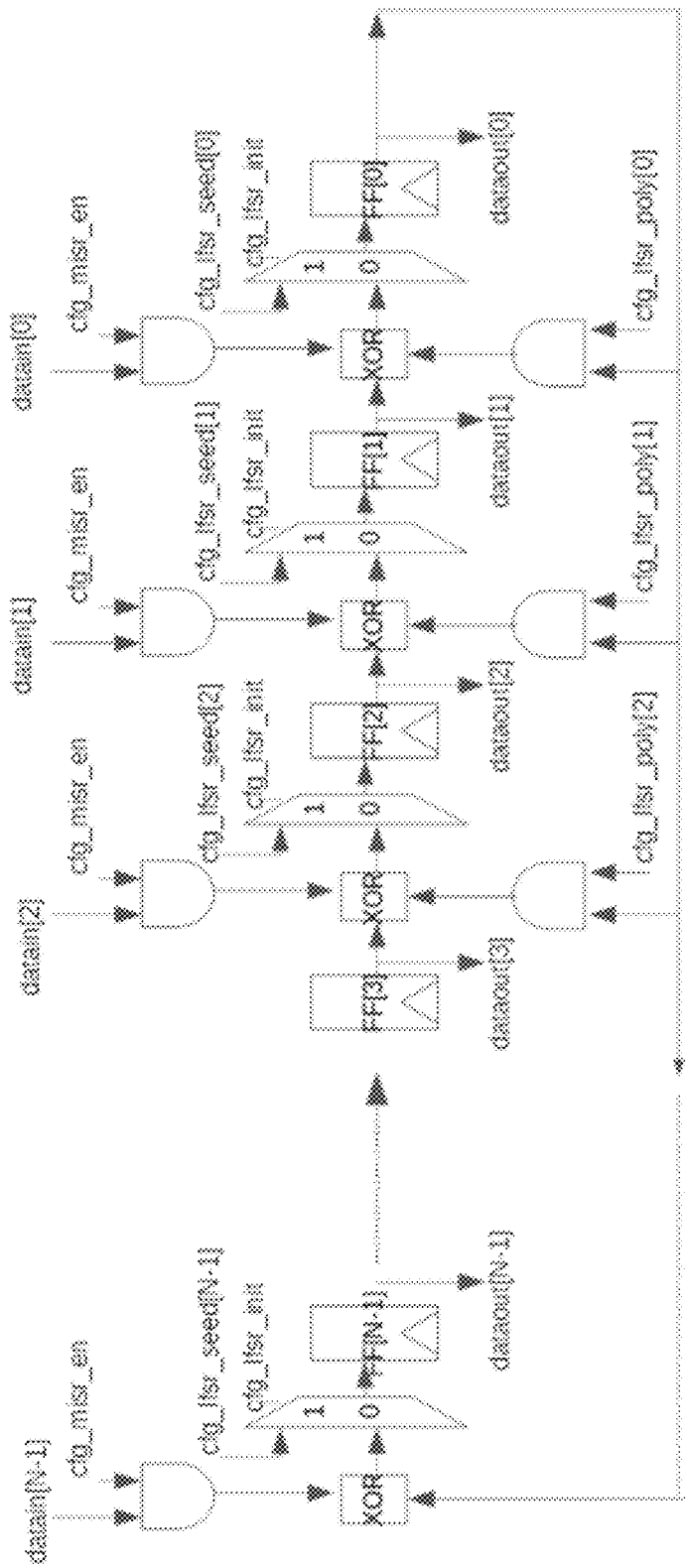
FIG. 10 shows a block diagram of programmable linear-feedback shift register (LFSR) or multiple-input signature register (MISR) according to an embodiment of the present invention.

Referring to FIG. 10, the CCNOC (5) uses a credit scheme to regulate the transfer of packet from one port to another. A credit is sent from receiver to sender on the rx_credit bus to indicate the number of free slots it has to accept CCNOC packets. This value is asserted and held stable. One unit of credit is equivalent to a 1-byte transfer on tx_data, the width of tx_data is 8-bit from the sender to the receiver. Upon reset assertion, a sender will initialize its downstream ports having zero credits hence no data can be transmitted. After reset de-assertion, a receiver can begin to advertise the number of FIFO empty slots that it has in the form of credits to the sender. The receiver is allowed to send at most three credits every cycle and it could take at most twenty cycles to advertise its total credits to the sender. For example, if the FIFO implemented in the receiver has eight entries equivalent to 8 bytes, then the receiver asserts 2'b11 for the first two cycles followed by 2'b10 on the $3^{rd}$ cycle. It should then drive 2'b00 until it has extra credits to free up. Upon receipt of the credits, the sender increments its internal counter for the corresponding downstream port by the amount of credit that has been freed up at the receiver end. Whenever the sender transmits a byte of payload, it needs to increment its internal counter by 1. The sender is allowed to send transactions to the receiver as long as its credit counter for that port is not zero.

In another credit scheme, instead of receiver sending the freed up credits cycle by cycle, the receiver can also opt to advertise the total number of credits using an N-bit credit bus. For example, if the receiver has eight entries equivalent to 8 bytes, the receiver can assert a pseudo-static value of 8 on a 4-bit bus. Whenever the receiver has more credits freed up, it only needs to change the value of the credit bus in one shot, for example from 8 to 12. The advantage of this is that the sender does not need to increment its internal counter since it can obtain the total credits value directly from this credit bus. An additional advantage is that the credit bus is not timing critical since its value is pseudo-static.

CCNOC Enumeration

When the CCNOC Master enumerate through all the attached nodes, the master will check whether the port is attached to a slave. If the downstream port is not attached with a slave node, the tx_stub for that port is tied to 1. If tx_stub is tied to 0, the master sends a "Write Packet" with N=1 to the slave port with ID=0, data=N where N=Write Data Payload from the "Write Packet" it received from its upstream node. On the slave node, the port of which the slave node received this very first packet is assigned as an upstream port, while all other ports of the slave node are assigned as a downstream ports and the slave assigns itself with ID=N. If there are one or more downstream ports that has its tx_stub tied to 0, the slave node will select the first downstream port and forward the "Write Packet" with ID=0, data=N+1. If there are no downstream ports such that all ports have its tx_stub tied to 1, then the slave node will generate a "Message Packet" with the "Enum Resp" with data=its own slave ID and send the packet upstream. This will inform the upstream node that the enumeration has reached a leaf slave node. The slave node loops through the prescribed steps all of its downstream ports. If the slave node received a "Write Packet", it will look for a downstream slave node and forward the "Write Packet" with ID=0, data=N+1. If the slave node received a "Message Packet" with the "Enum Resp": If there another downstream port with its tx_stub tied to 0, send a "Write Packet" to that downstream port with ID=0, data=(Data of the "Message Packet" with "Enum Resp")+1, else if there are no other downstream port with its tx_stub tied to 0 or if all downstream ports have their tx_stub tied to 1, generate a "Message Packet" with the "Enum Resp" with data=(Data of the "Message Packet" with "Enum Resp"). If the CCNOC slave sets its own ID to 3. Since there are no more downstream ports, Slave 3 returns the "Message Packet" with "Enum Resp" upstream with data=3. Upon slave 1 receiving the "Message Packet" from Slave 3, it sends a "Write Packet" with data=4 to the right most slave. The slave sets its own ID to 4, since there are no more downstream ports, Slave 4 returns the "Message Packet" with "Enum Resp" upstream with data=4. Upon slave 1 receiving the "Message Packet" from Slave 4, it sends a "Message Packet" with "Enum Resp" upstream with data=4. Upon the CCNOC Master receiving the "Message Packet" with "Enum Resp" from Slave 4, it sends "Write Packet" with data=5 to the right most slave. The slave sets its own ID to 5 and sends a "Write Packet" with data=6 to its single downstream port. The last slave sets its own ID to 6, since there are no more downstream ports, Slave 6 returns the "Message Packet" with "Enum Resp" upstream with data=6. Upon slave 5 receiving the "Message Packet" from Slave 6, it sends a "Message Packet" with "Enum Resp" upstream with data=6. The CCNOC Master receives the "Message Packet" from Slave 5. Since the CCNOC Master has enumerated all its downstream ports, enumeration flow completes and it knows that there is a total of 6 slaves in the NOC topology.

CCNOC Timestamp Synchronization

The CCNOC timestamp synchronization acts as means to allow the different sequencers attached to different CCNOC nodes to know and understand a global time. Once the global time is known, an alarm can be armed on the different sequencers to allow for a time-synchronized operation. The time synchronization is done when the CCNOC bus is idle which is no outstanding reads or writes and after CCNOC enumeration has completed. Each slave also implements the registers listed in Table 6 with the Timestamp Register being a free running rollover counter that increments every rising clock edge.

TABLE 6

| Register | Attributes | Description |
| --- | --- | --- |
| Timestamp | R/W | Free running rollover counter that increments every rising clock edge. This register can be read from and written over. Once overwritten with the new value, it will continue counting from the new written value. |
| Alarm Timestamp | R/W | Write the time of the alarm so that when Timestamp = = Alarm Timestamp, the action specified in the Alarm Action Register will be executed |
| Alarm Action | R/W | Bit [0]: alarm enable<br>Bit [1]: 1 for read, 0 for write<br>Bit [11:2]: 12-bit register address, since register is always 32-bit aligned, lower 2-bit address is assumed 0 |
| Alarm Data | R/W | 32-bit data to be written into the specified register for 'write' alarm action. For 'read' alarm action, the slave node will read from the specified register address and store the read data here. | master node receives the "Message Packet" with "Enum Resp" but no longer has other downstream ports that have not been sent with the "Write Packet" with ID=0, it will consider that the enumeration process has been completed. The data in the "Message Packet" with "Enum Resp" equals to the total number of slaves that was enumerated.

Figure 11:
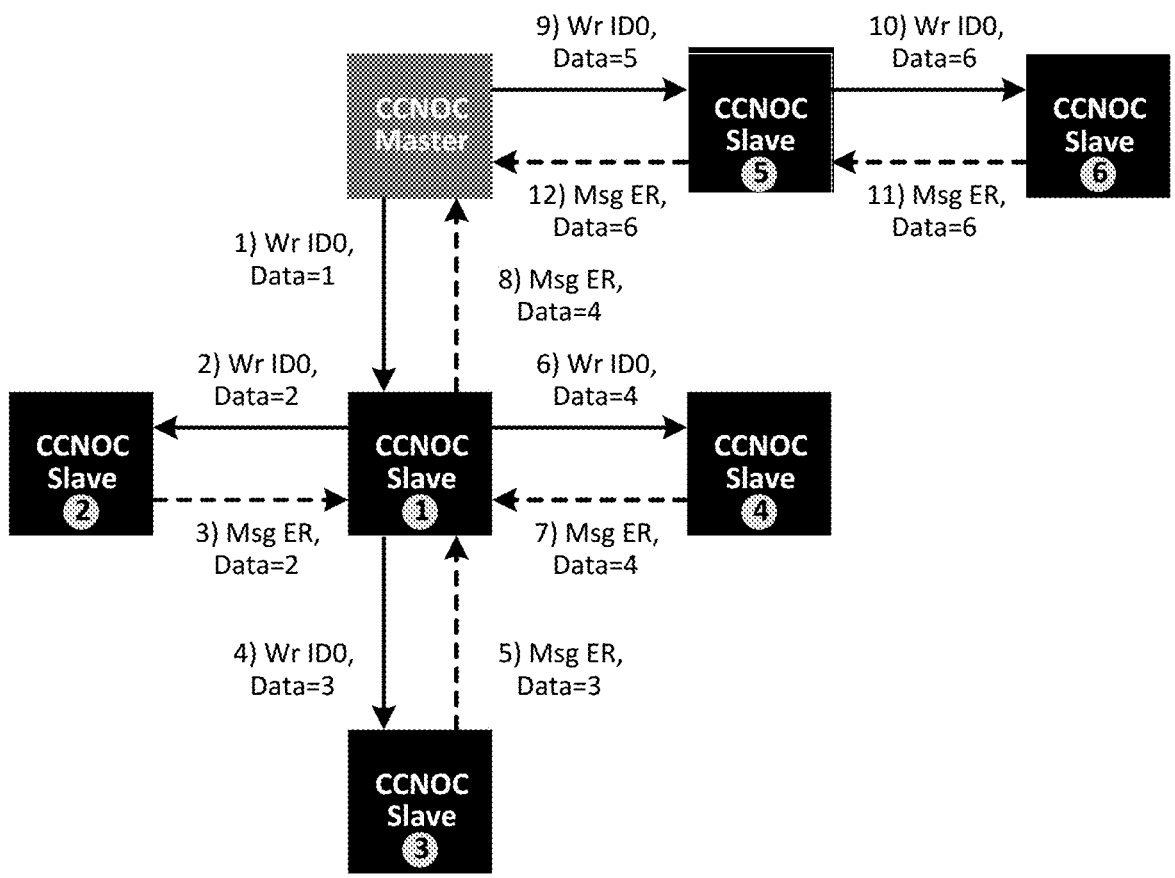
FIG. 11 shows the enumeration of a command center network-on-chip (CCNOC) according to an embodiment of the present invention.

Referring to FIG. 11, the CCNOC Master first sends "Write Packet" with ID=0 and data=1 to left most downstream port. The left most slave receives this, sets its own ID to 1 and then forwards the "Write Packet" with ID=0 and data=2 to its left most slave. The following slave sets its own ID to 2. Since there are no more downstream ports (all tx_stub is tied to 1), Slave 2 returns the "Message Packet" with "Enum Resp" upstream with data=2. Upon Slave 1 receiving the "Message Packet" from Slave 2, it sends a "Write Packet" with data=3 to the next left most slave. The As an illustration, the CCNOC Master's Timestamp has a value of 1000 and there are 5 pipelines between the CCNOC Master and Slave 1. The CCNOC Master starts by sending a "Read Packet" to Slave 1. The CCNOC Master should receive the "Read Response" after 10 clocks. At the timestamp of 1020, the CCNOC Master sends a "Write Packet" to Slave 1's Timestamp Register with the data which has increment of 5 to the current timestamp which is 1025. Five clocks later, Slave 1 receives this packet and sets its Timestamp Register to 1025. As a result, both the CCNOC Master and Slave 1 Timestamp Registers are at 1025 and said to be fully synchronized.

The timestamp is used in conjunction with the Alarm Register to perform synchronized actions across all slave nodes. To achieve this, the CCNOC Master first writes to the Alarm Action Register or Alarm Data Register if a write action is intended with the intended action of the slave node of interest. The Alarm Timestamp is then written with a future timestamp of which a synchronized event is intended e.g. to kick-off the sequencers across different channels or within the same channel. When the respective slaves' Timestamp Register reaches the count in the Alarm Timestamp, the Alarm Action is triggered simultaneously on the slave nodes of interest.

Figure 12A:
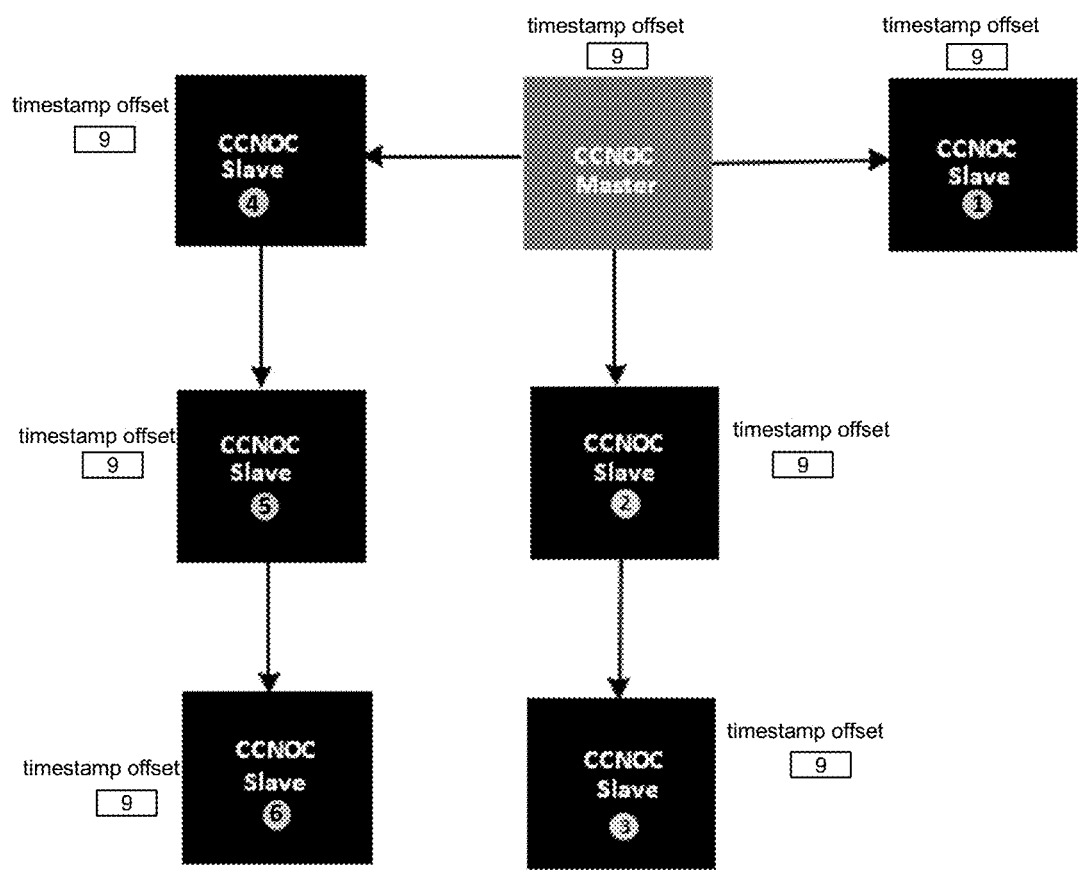
FIG. 12A illustrates the connection between CCNOC network with one Master and multiple.

Referring to FIG. 12A, the CCNOC network comprises one master and multiple slaves connected in a hierarchical fashion is an alternate method for timestamp synchronization across all slaves with respect to the CCNOC master. The slaves have a different initial timestamp as the slave is brought out of reset at different time. However, the physical connection between the slaves are static and the number of clock cycles required to transfer a write packet between the slaves is known. Each slave comprises a timestamp offset register which represents an additional offset to be added to a write packet's data payload as the write packet travels out from this slave. The timestamp offset register is programmed with the number of clock cycles required for a write packet to travel from the slave to another slave. If identical slaves are implemented, then all slaves 'timestamp offset' register can be programmed with the same value. The timestamp offset register can also be implemented as a constant value for simplification.

Figure 12B:
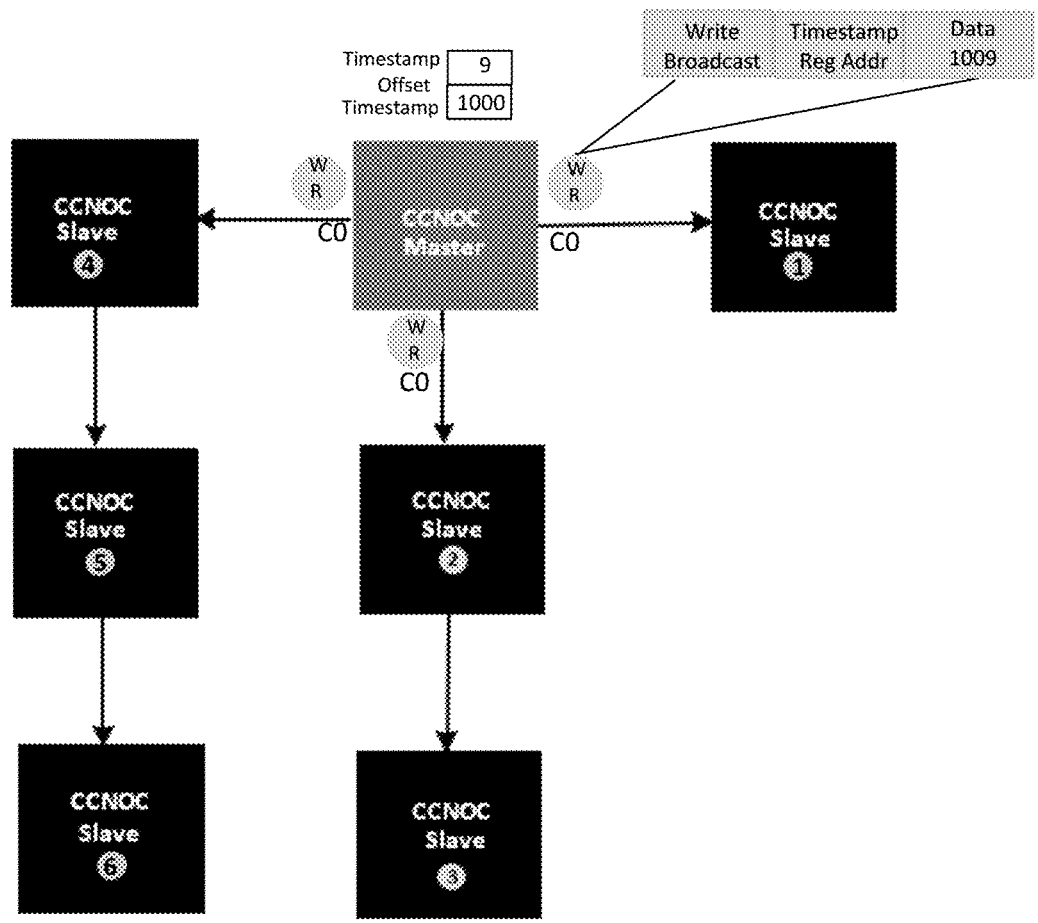
FIG. 12B illustrates when CCNOC master is programmed and send write packet to slave 1,2 and 4.

Referring to FIG. 12B, the timestamp offset register value of each slave has been programmed with but not limited to 9. The CCNOC master also comprises a timestamp offset register which can be programmed with the value equal to the number of clock cycles required for a write packet to travel from the CCNOC master to the CCNOC slaves directly connected to it. The timestamp synchronization can be done with a single broadcast write packet, whereby the CCNOC master broadcast a write packet to all slaves with the packet's data payload comprising the value of the master's timestamp. In this example, the CCNOC master's timestamp value is programmed with but not limited to 1000, and since the timestamp offset value of the CCNOC master has been programmed with but not limited to 9, the write packet's data payload is modified by adding 9 to 1000, thus creating a modified write packet with data payload of 1009 when it is sent out to slave 1, 2, and 4 at cycle 0, C0.

Figure 12C:
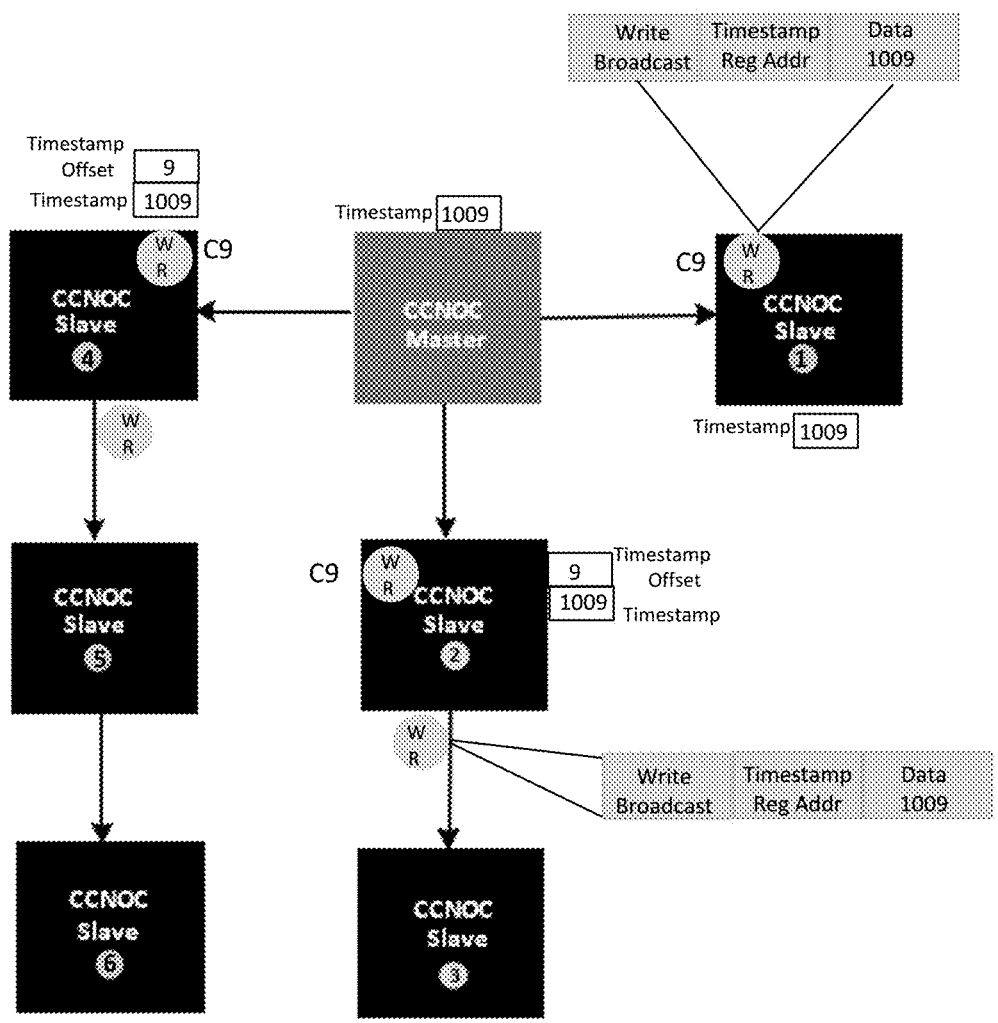
FIG. 12C illustrates when slave 1,2 and 4 receive the write packet and forward to slave 3 and 5.

Referring to FIG. 12C, the write packet is received after nine clock cycles at cycle 9, C9 and its timestamp register is written with the value of 1009. Hence, the timestamp of slave 1 is said to be synchronized with the CCNOC master as both nodes comprise same timestamp value which is 1009. At the same time, slave 2 and 4 both comprise the updated timestamp register with the value of 1009 at cycle 9, C9. Slave 2 and 4 will both added the value in their respective timestamp offset register before forwarding the write packet to slave 3 and 5 and the write packet will comprise the data payload of 1018 resulting from the increment in a value of 9.

Figure 12D:
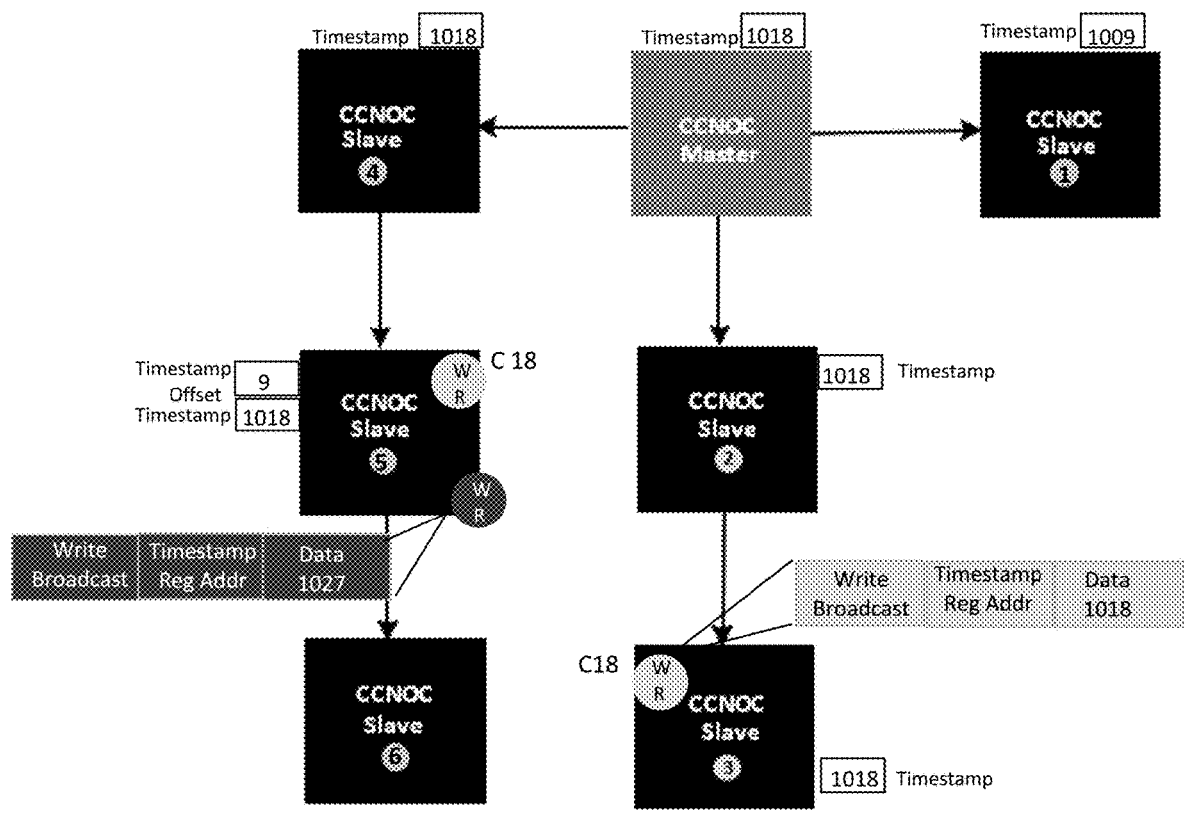
FIG. 12D illustrates when slave 3 and 5 receive the write packet and forward to slave 6.

Referring to FIG. 12D, the slave 3 and 5 at cycle 18, C18 receives the write packet and both slave set the timestamp register with the value of the write packet data payload, which is 1018. The slave 3 and 5 are said to be synchronized with the CCNOC master since both slaves comprise identical timestamp as the master. Next, slave 5 will add the value in its timestamp offset register and forward the write packet with the data payload of 1027 to slave 6

Figure 12E:
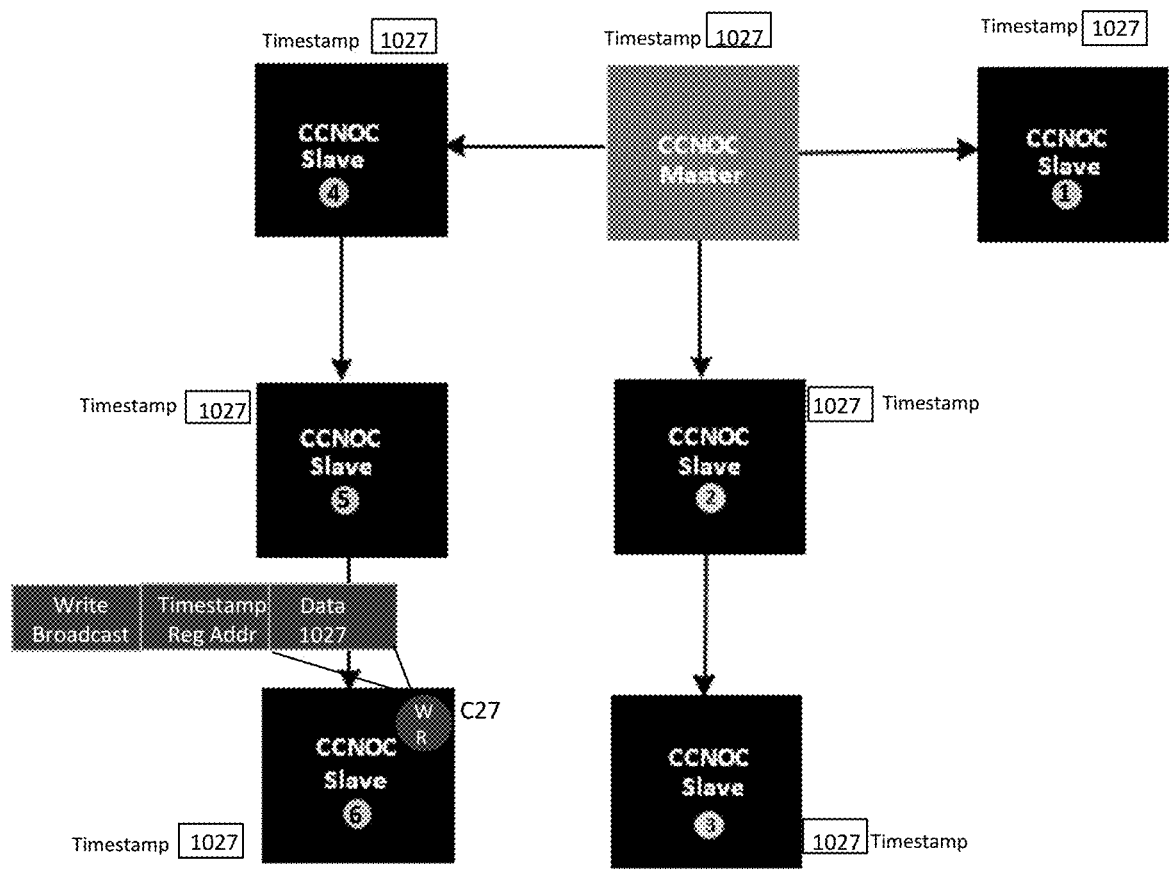
FIG. 12E illustrates when slave 6 receives the write packet.

Referring to FIG. 12E, the slave 6 receives the write packet from slave 5 and sets the timestamp register with the value of 1027. Finally, the timestamp synchronization is completed as all the slaves comprise the same timestamp as the CCNOC master.

In the present invention, the command and address sequencer and data sequencer act as a means to orchestrate the signalling sequencing. Moreover, the invention forming complex memory sequences triggered by the chaining of the sequencer clusters. Other than that, the memory sequencer system supports concurrent row and column command sequencing or single address stream command sequencing. Furthermore, the memory sequencer system addresses the ability to synchronize the different sequencers attached to the CCNOC capable of self-enumeration so that they can be orchestrated deterministically to form signal to the wide memory interface protocol.

The exemplary implementation described above is illustrated with specific characteristics, but the scope of the invention includes various other characteristics.

Various modifications to these embodiments are apparent to those skilled in the art from the description and the accompanying drawings. The principles associated with the various embodiments described herein may be applied to other embodiments. Therefore, the description is not intended to be limited to the embodiments shown along with the accompanying drawings but is to be providing broadest scope of consistent with the principles and the novel and inventive features disclosed or suggested herein. Accordingly, the invention is anticipated to hold on to all other such alternatives, modifications, and variations that fall within the scope of the present invention and appended claim.

It is to be understood that any prior art publication referred to herein does not constitute an admission that the publication forms part of the common general knowledge in the art.

The invention claimed is:

1. A memory sequencer system for external memory protocols, the memory sequencer system comprising:
   a control center including a microcontroller;
   a control center network-on-chip including nodes interconnected to synchronize and co-ordinate communications;
   a command and address sequencer to generate commands and addresses, and control the commands based on the respective addresses for specific memory protocols; and
   at least one data sequencer to generate pseudo-random or deterministic data patterns for each byte lane of a memory interface, wherein
   said command and address sequencer and said data sequencer are chained to form complex address and data sequences for memory interface training, calibrating and debugging;
   said control center network-on-chip interconnecting the control center with said command and address sequencer and data sequencer;
   wherein said command and address sequencer includes a command sequence table to interpret each entry by cycling through said table to orchestrate command, address or data sequence generation; and
   wherein said address sequencer includes a set of adders or comparators to trigger incrementing of a different adder or comparator set within the same set based on a trigger value.

2. The memory sequencer system as claimed in claim 1, wherein said memory sequencer system is inserted in between a DDR PHY Interface of a memory controller and a physical layer transmit or receive path for the memory interface command and data.

3. The memory sequencer system as claimed in claim 1, wherein the command and address sequencer includes a command sequencer and an address sequencer.

4. The memory sequencer system as claimed in claim 3, wherein the command and address sequencer includes a command encoder and a command decoder.

5. The memory sequencer system as claimed in claim 1, wherein the data sequencer further includes a read data storage having a read data buffer.

6. The memory sequencer system as claimed in claim 1, wherein the control center network-on-chip connected to AXI-lite to receive, convert and deliver read or write commands into a network within the memory sequencer system.

7. The memory sequencer system as claimed in claim 1, wherein the control center network-on-chip includes a master node and a plurality of slave nodes organized in a tree topology, each node comprising a set of registers that is memory mapped to AXI memory space.

8. The memory sequencer system as claimed in claim 7, wherein the master node has multiple downstream ports, each slave node has one upstream port and multiple downstream ports.

9. A method of memory sequencing for external memory protocols, the method comprising:
generating command, address and data sequence for each entry;
selecting one or more address sequencers for generating address;
comparing a trigger value to trigger incrementing of adder or comparator at the address sequencers;
chaining the adder or comparator to construct address sequences;
encoding and decoding the command and address to trigger data path;
implementing data latency with a shift register according to a number of clock cycles;
transmitting the data including write data and read data to a data sequencer;
converting AXI-lite read or write commands into control center network-on-chip read or write commands;
transferring said control center network-on-chip read or write commands to targeted slave nodes of said control center network-on-chip based on the address and identification of said slave nodes;
enumerating the slave nodes to assign the identification to each slave node; and
synchronizing control center network-on-chip timestamp and alarm registers.

10. The method as claimed in claim 9, wherein the command, address and data sequence are generated according to programming values of a command sequence table.

11. The method as claimed in claim 10, wherein the programming values determines amount of delay for the command, address and data sequence.

12. The method as claimed in claim 9, wherein encoding a write command triggers write transmit data path and encoding a read command triggers read receive data path to capture and upload the data from the memory device.

13. The method as claimed in claim 9, wherein decoding a read command triggers write transmit data path and decoding a write command triggers read receive data path to capture and unload the data from the memory host.

14. The method as claimed in claim 9, wherein the step of transmitting the write data further comprising cycling through a write data sequence table to generate a write data transmitting pattern.

15. The method as claimed in claim 9, wherein the step of transmitting the read data further comprising cycling through a read data sequence table to generate a read data transmitting pattern.

16. The method as claimed in claim 9, wherein the step of transmitting the data to the data sequencer further comprising capturing read data in a read data buffer for debug and checking operations, signature generation, or bit comparison.

17. The method as claimed in claim 9, wherein the commands are transferred in a packet include a write packet, a read packet, a completion packet and a message packet.

18. The method as claimed in claim 9, wherein the step of synchronizing control center network-on-chip timestamp further comprising:
sending a read packet from control center network-on-chip master node o one slave node;
reading the timestamp register of the slave node;
recording the sending time of the read packet;
sending a read response to the read packet when the slave node receives the read packet;
recording the receiving time of read response by control center network-on-chip master node;
sending a write packet with current timestamp and pipeline delay data to the timestamp register of the slave node; and
repeating the preceding steps from sending a read packet to slave node until all slave nodes have the same timestamp as control center network-on-chip master node; wherein
the pipeline delay is half of a round trip delay; and
the round trip delay is the difference between the receiving time of the read response and the sending time of read packet.

19. The method as claimed in claim 9, wherein the step of synchronizing control center network-on-chip timestamp further comprising:
programming the timestamp offset register of control center network-on-chip master node and slave node with the number of clock cycles;
broadcasting a write packet from control center network-on-chip master node o all slave nodes with a packet's data payload;
setting the timestamp register value of slave node with the received data;
sending the written timestamp value to the downstream slave node; and
repeating the preceding steps from setting the timestamp register value until all slaves have the same timestamp as control center network-on-chip master node; wherein
the write packet travel from control center network-on-chip master node to the control center network-on-chip slave node according to the number of clock cycles; and
the data payload containing the timestamp value of the control center network-on-chip master node.

20. The method as claimed in 18, wherein the timestamp is used in alarm triggering to perform synchronized actions across all slave node.

21. The method as claimed in 19, wherein the timestamp is used in alarm triggering to perform synchronized actions across all slave node.

\* \* \* \* \*